United States Patent [19]
Battaglia et al.

[11] Patent Number: 5,900,652
[45] Date of Patent: May 4, 1999

[54] APPARATUS FOR THE LOCALIZED REDUCTION OF THE LIFETIME OF CHARGE CARRIERS, PARTICULARLY IN INTEGRATED ELECTRONIC DEVICES

[75] Inventors: Anna Battaglia, Tremestieri Etneo; Piergiorgio Fallica; Cesare Ronsisvalle, both of Catania; Salvatore Coffa, Tremestieri Etneo; Vito Raineri, Mascalucia, all of Italy

[73] Assignee: Consorzio per la Ricerca sulla Microelettronica nel Mezzogiorno, Catania, Italy

[21] Appl. No.: 08/507,048

[22] Filed: Jul. 25, 1995

[30] Foreign Application Priority Data

Jul. 25, 1994 [EP] European Pat. Off. .............. 94830371

[51] Int. Cl.$^6$ ..................................................... H01L 29/74
[52] U.S. Cl. .......................... 257/135; 257/148; 257/156; 257/394; 257/547; 257/590
[58] Field of Search .................................. 257/133, 135, 257/142, 148, 156, 328, 341, 394, 547, 590

[56] References Cited

U.S. PATENT DOCUMENTS

| | | | |
|---|---|---|---|
| 4,053,925 | 10/1977 | Burr et al. | 357/64 |
| 4,762,802 | 8/1988 | Parrillo | 437/24 |
| 5,198,371 | 3/1993 | Li | 437/11 |

FOREIGN PATENT DOCUMENTS

| | | | |
|---|---|---|---|
| 2320636 | 3/1977 | France | 129/227 |
| 3205877 | 9/1991 | Japan . | |
| 5102161 | 4/1993 | Japan . | |

OTHER PUBLICATIONS

Abstract of BE 843794 (Nov. 3, 1976), related to FR–A–2, 320,636, obtained from the Derwent world patent index database.

Proceedings of the 3rd International Symposium on Power Semiconductor Devices and ICS, ISPSD "91 Baltimore, MD, US 2Apr. 22–24 1991, New York, NY, USA, IEEE USA, Akiyama H. et al. " Partial Lifetime Control In IGBT By Helium Irradiation Through Mask Patterns.

Physical Review B (Condensed Matter), Jul. 15, 1994, USA vol. 50. No. 4, ISSN 0163–1829, pp. 2458–2473, Seager C. H. et al., "Electrical Properties of He–Implantation–Produced Nanocavities in Silicon".

Patent Abstracts of Japan, vol 017, No. 453 (E–1417), Aug. 19, 1993 & JP–A–05 102161 Toshiba Corp.

Nuclear Instruments & Methods in Physics Research, Section B. Oct. 1987, Netherlands, vol. b28, No. 3, pp. 360–363, Evans J. H. et al., "The annealing of Helium–Induced Cavities in Silicon and the Inhibiting Role Of Oxygen".

Nuclear Instruments & Methods in Physics Research, Section B, Jul. 1987, Netherlands, vol. b27, No. 3, pp. 417–420, Griffioen C C et al., Helium Desorption/Permeation From Bubbles in Silicon: A Novel Method of Viod Production.

Primary Examiner—Minh Loan Tran
Attorney, Agent, or Firm—Wolf, Greenfield & Sacks, P.C.

[57] ABSTRACT

A method and apparatus for the localized reduction of the lifetime of charge carriers in integrated electronic devices. The method comprises the step of implanting ions, at a high dosage and at a high energy level, of a noble gas, preferably helium, in the active regions of the integrated device so that the ions form bubbles in the active regions. A further thermal treatment is performed after the formation of bubbles of the noble gas in order to improve the structure of the bubbles and to make the noble gas evaporate, leaving cavities in the active regions.

28 Claims, 6 Drawing Sheets

APPARATUS FOR THE LOCALIZED REDUCTION OF THE LIFETIME OF CHARGE CARRIERS, PARTICULARLY IN INTEGRATED ELECTRONIC DEVICES

BACKGROUND OF THE INVENTION

1. Field of the Invention

The present invention relates to a method and apparatus for the localized reduction of the lifetime of charge carriers, particularly in integrated electronic devices.

2. Discussion of the Related Art

As is known in integrated circuit technology it is often necessary to electrically insulate some regions of the chip from others. For example, in a VIP circuit the driving circuit must be insulated from the power transistor.

One technique used for insulation is junction insulation. However, this technique unavoidably forms parasitic transistors which ultimately define the actual operating limits of the entire structure of the integrated circuit.

FIG. 1 illustrates a typical structure of a MOSFET power transistor circuit. The MOSFET structure typically comprises a substrate 1, doped with impurities of the $N^+$ type, which acts as a drain terminal of the MOSFET device. An epitaxial layer 2 of the $N^-$ type is grown on the substrate 1. Two regions 3a and 3b of the $P^+$ type, known as deep-body regions, are located in the epitaxial layer. Above the respective deep-body regions 3a and 3b there are body regions 4a and 4b which are doped with P-type impurities. Two source regions, respectively 5a and 5b for the body region 4a, and 5d and 5c for the body region 4b, are accommodated in each one of the body regions 4a and 4b.

An oxide layer 10a is located above the adjacent edges of the body regions 4a and 4b, and the polysilicon gate 6a is placed on layer 10a. The gate 6a is covered by a dielectric layer 7a, which is preferably a chemical vapour deposited oxide, such as P-Vapox. Gate terminals 6b and 6c, having related oxides 10b and 10c and dielectric layers 7b and 7c, are located at the edges of the body regions 4a and 4b.

Finally, the entire structure is covered with a layer of metal, preferably aluminum, which makes contact with the body regions 4a and 4b and with the source regions 5a, 5b, 5c, and 5d.

This structure includes parasitic transistors which limit its operation. The emitters, bases and collectors of these parasitic transistors are respectively the sources 5a–d, the deep-body regions 3a and 3b or body regions 4a and 4b, and the drain, which is constituted by the substrate 1. The emitters, bases and collectors of the parasitic transistor comprise their active regions. One of these parasitic transistors is shown in FIG. 1 and is designated by the reference numeral 9. The emitter of the transistor 9 is constituted by the source region 5d, the base is constituted by the body/deep-body region 3b, and the collector is constituted by the substrate 1. It is evident that there are at least three other parasitic transistors which are present with the source/deep-body/drain combinations. They have not been illustrated for the sake of simplicity.

The following three methods may be used to reduce the gain of the parasitic transistor 9. First, the deep-body region 3b, i.e. the base of the transistor, may be doped heavily. Secondly, the source 5d and the deep body 3b or the body 4b, i.e. the emitter and the base of the transistor 9, are shorted. Third, the source 5d may be manufactured as short as possible, within the limits of the photolithographic technology available.

Despite these methods, when the PMOS is on there is a voltage drop in the deep-body portion underlying the source. A positive bias $V_{be}$ can thus be formed between the base and the emitter of the transistor 9, turning the transistor on. The gain of this parasitic transistor increases as current and temperature increase, limiting the performance of the PMOS.

FIG. 2 illustrates a typical structure of an IGBT device. The structure of the IGBT is similar to the structure of the PMOS device of FIG. 1, except that there is an additional epitaxial layer 2a which is interposed between the epitaxial layer 2 and the substrate 1 and is doped with impurities of the $N^+$ type.

The IGBT device includes an NPN-type parasitic transistor 10 of FIGS. 2 and 5 the collector, base, and emitter of which are formed respectively by the source region 5d, the body/deep-body region 4b/3b, and the epitaxial layer 2 or 2a. The effect of the transistor 10 combines with the effect of another parasitic transistor 11 of the PNP type, the collector, base, and emitter of which are respectively the body/deep-body 4b/3b, the epitaxial layer 2 or 2a, and the substrate 1. Of course other parasitic transistors can form in the other body/deep-body region.

The two parasitic transistors 10 and 11 constitute a thyristor. In order to avoid activating this thyristor it is necessary to reduce the gain of the two transistors so that $\alpha\text{NPN} + \alpha\text{PNP} < 1$.

Two techniques are used to reduce the gain of the PNP transistor 11. The first technique is the introduction of a buffer layer between the P-type substrate 1 and the N-type drain. This layer is heavily doped with N-type impurities. The second technique is to implant a lifetime killer metal, such as gold or platinum, which is then diffused to distribute it uniformly throughout the thickness of the wafer. The gain of the NPN transistor 10 is of course also reduced by this.

The operating conditions for which the above described parasitic components are particularly detrimental are, in the case of the PMOS (FIG. 1), dynamic dV/dt and unclamped conditions. In the case of the IGBT device (FIG. 2), static and dynamic latch-up are possible.

A third example of a power device in which parasitic transistors reside is a Vertical Intelligent Power device, better known as a VIP device. FIG. 3 illustrates a typical structure of a VIP device, The VIP device comprises an $N^+$-type substrate 31 above which there is an N-type epitaxial layer 32. The epitaxial layer 32 accommodates the $P^+$-type buried layer 33. The $P^+$-type buried layer 33 accommodates the low-power control devices, typically a vertical NPN transistor 51 and a lateral PNP transistor 52. The $P^+$ buried layer also acts as insulation for the low-power devices. The vertical NPN transistor 51 comprises a first $N^+$-type buried layer 34 which is connected to a collector terminal 35 by means of a sinker region 36 which is also doped with $N^+$-type impurities. The $N^+$ buried layer 34 and the $N^-$ type region 41 that accommodates the $P^+$-type base 37 and the $N^+$-type emitter 38 of the NPN transistor are surrounded by two $P^+$-type insulation regions 39 and 40. These insulation regions form, together with the $P^+$ buried layer 33, an insulation well of the N region 41.

Next to the vertical NPN transistor 51 is a lateral PNP transistor 52. This transistor also includes an $N^+$ buried layer 42 which is connected to the base terminal 43 by means of a sinker region 44. The $N^-$ type region 45 accommodates the emitter 46 and the collector 47, both of which are of the P type, and is insulated by the insulation region 40 and an additional insulation region 48. The insulation regions 39, 40 and 48, together with the P+ buried layer, form a region that is termed the P-well.

The power device 53 comprises a base region 49, which is connected to the base terminal 50, and an emitter region 54, which is connected to an emitter terminal 55. The collector of the power device 53 is constituted by a metallic layer 30 which is connected to the substrate of the entire VIP device.

In the above described VIP structure, the low-power circuit (NPN transistor 51 and PNP transistor 52) must be insulated from the power transistor 53. The technique commonly used is junction insulation. However, this technique, as mentioned, unavoidably leads to the formation of parasitic transistors that limit the operation of the device.

The first example of a parasitic transistor is the transistor 61, having its emitter constituted by the base 37 of the NPN transistor 51, its base is constituted by the collector 35 of the NPN transistor 51, and its collector constituted by the P+ region or buried layer (P-well) 39.

The second parasitic transistor is the transistor 62, having its emitter constituted by the base 43 of the PNP transistor 52, Its base constituted by the region 40 of the P-well, and its collector constituted by the collector 35 of the NPN transistor 51.

The third parasitic transistor is the transistor 63, having its emitter constituted by the emitter 46 of the PNP transistor 52, its base constituted by the base 43 of the PNP transistor 52, and its collector constituted by the region 48 of the P-well.

The fourth parasitic transistor is the transistor 64 (which is superimposed on the transistor 63 in the FIG.), which is identical to the transistor 63, except that its emitter is constituted by the collector 47 of the PNP transistor 52.

The fifth parasitic transistor is the transistor 65, having its emitter constituted by the base 43 of the PNP transistor 52, its base constituted by the region 48 of the P-well, and its collector constituted by the epitaxial layer 32.

The sixth parasitic transistor is the transistor 66, having its emitter constituted by the base 49 of the power device 53, its base constituted by the epitaxial layer 32, and its collector constituted by the region 48 of the P-well.

It is evident that there are several parasitic transistors, each of which imposes limitations on the operating versatility of the structure.

As mentioned above, in order to obviate these parasitic components, there are various solutions, including the implantion or deposition of a metal (gold and platinum), and the subsequent diffusion and irradiation with nuclear particles (neutrons, protons and alpha), electrons or X-rays. The drawback of metal implanting is the complication of the processing flow-chart, whereas the drawbacks of irradiation are its high cost and the fact that it is difficult to control, since the thermal assembly steps reduce the effect of irradiation by a certain amount.

It should be stressed that in power devices there are not only parasitic transistors but also parasitic diodes. Furthermore, in addition to the three above described parasitic devices there are also others, such as fast-recovery diodes, transistors for small signals, thyristors, etc.

SUMMARY OF THE INVENTION

The foregoing problems of the prior art are overcome by one illustrative embodiment of the invention, in which a process is provided for the localized reduction of the lifetime of charge carriers, particularly in integrated devices. The process comprises a step of implanting ions, at a high dosage and at a high energy level, of a noble gas in the active regions of the integrated device to produce bubbles of the noble gas in the active regions. A thermal treatment is then performed so that the ions coagulate to form larger bubbles in the active regions. An additional thermal treatment is then performed to make the noble gas evaporate after the formation of bubbles of the noble gas, leaving cavities in the active regions.

In another illustrative embodiment of the invention, an apparatus is provided with at least one active region located at a junction between a first semiconductor material and a second semiconductor material. The first semiconductor material has a plurality of cavities disposed adjacent to the second semiconductor material.

In yet another illustrative embodiment of the invention, an apparatus is provided with at least one active region formed at a junction of a first semiconductor material and a second semiconductor material. The apparatus includes means for locally reducing the lifetime of charge carriers in the active region.

BRIEF DESCRIPTION OF THE DRAWINGS

The characteristics and advantages of the invention will become apparent from the description of a preferred but not exclusive embodiment, illustrated only by way of non-limitative example in the accompanying drawings, wherein.

DETAILED DESCRIPTION

In accordance with one illustrative embodiment of the present invention, ions of a noble gas, preferably helium, are implanted at a high dosage ($>5 \times 10^{15}$ atoms/sq cm) and at a high energy level, so that they remain localized in a region of the silicon that contains active regions of the device or of the circuit. In this manner, gaseous bubbles form within these active regions.

A thermal process is then performed at intermediate temperatures (preferably at least and approximately 700° C.), making the helium atoms further coagulate so as to improve the structure of the small gaseous bubbles inside the crystal, i.e. the small gaseous bubbles coagulate to form larger bubbles. By this thermal process, the band containing the helium bubbles is reduced in width, thereby decreasing the value of the sheet resistivity of the band containing the helium bubbles.

By continuing the thermal process, the helium evaporates and diffuses through the silicon. The final result is that empty cavities each with a size of approximately 50 Å remain in the implanted active region.

In this manner, the amount of the silicon is reduced in the region that contains the helium cavities. The internal surfaces of the cavities are in fact recombination centers for carriers, both electrons and holes, in the device.

These cavities also constitute a large defect that acts as a gettering center, i.e. as a site where any foreign atoms, such as iron Fe, copper Cu, nickel Ni, and others segregate preferentially.

However, it is preferred that the silicon is cleaned from such foreign atoms because the lifetime reduction effect is far more difficult to control if such atoms are present in the cavities. If the effect caused by the holes is not sufficient, other lifetime killing atoms can be implanted or deposited in a controlled manner which, by diffusion, segregate in the cavities.

In the case of the PMOS device as well as in the case of the IGBT and of the VIP devices, helium implantation is localized at the base of the NPN parasitic transistor, i.e. below the source. This produces a shorter recombination lifetime in this region and consequently a shorter minority-carrier diffusion length and ultimately a lower gain for the parasitic transistor.

The methods for manufacturing the PMOS, IGBT and VIP devices according to the present invention are described hereafter.

Figure 1:
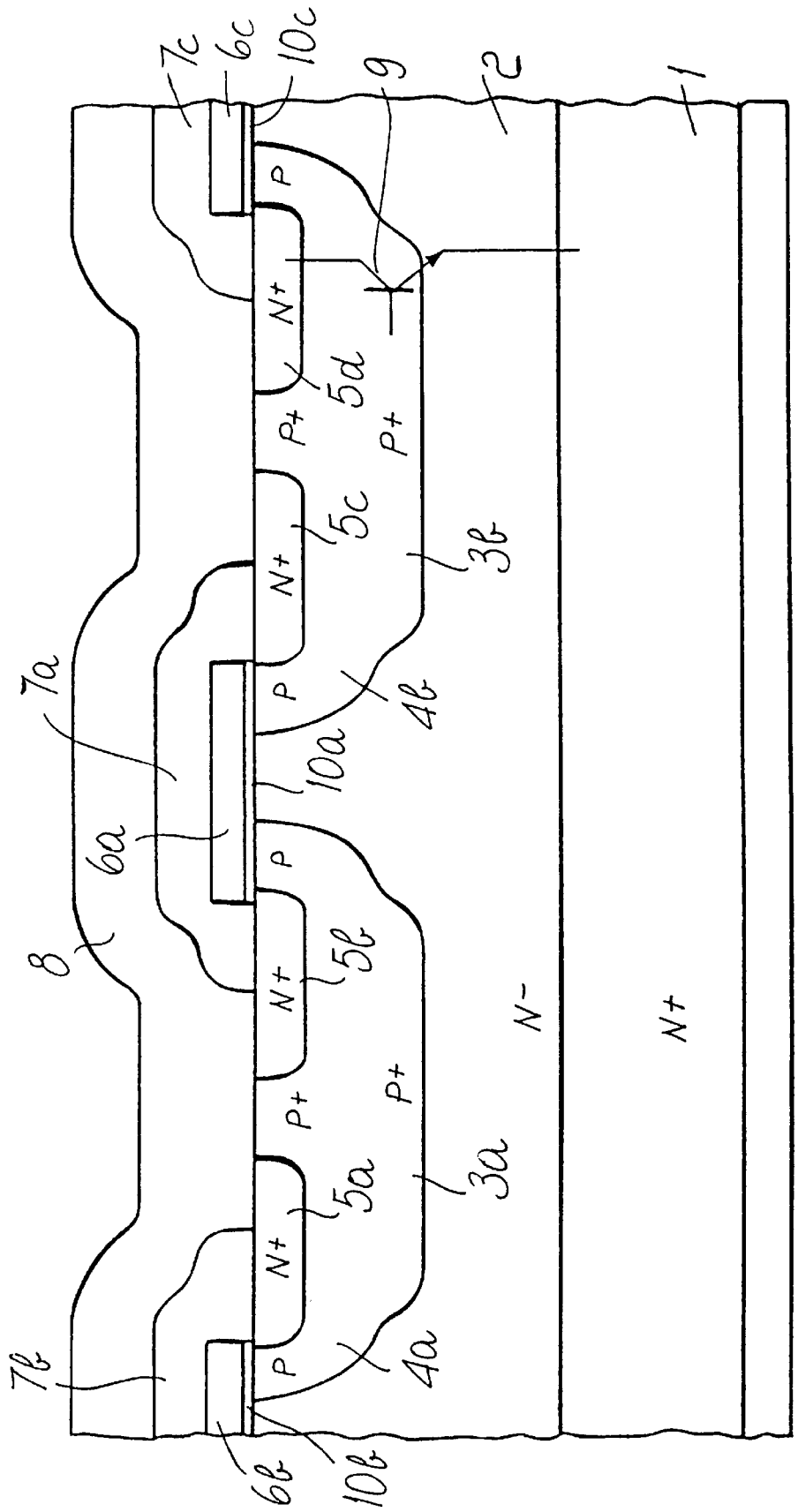
FIG. 1 is a cross-sectional view of a PMOS device with the corresponding parasitic transistors.
Figure 2:
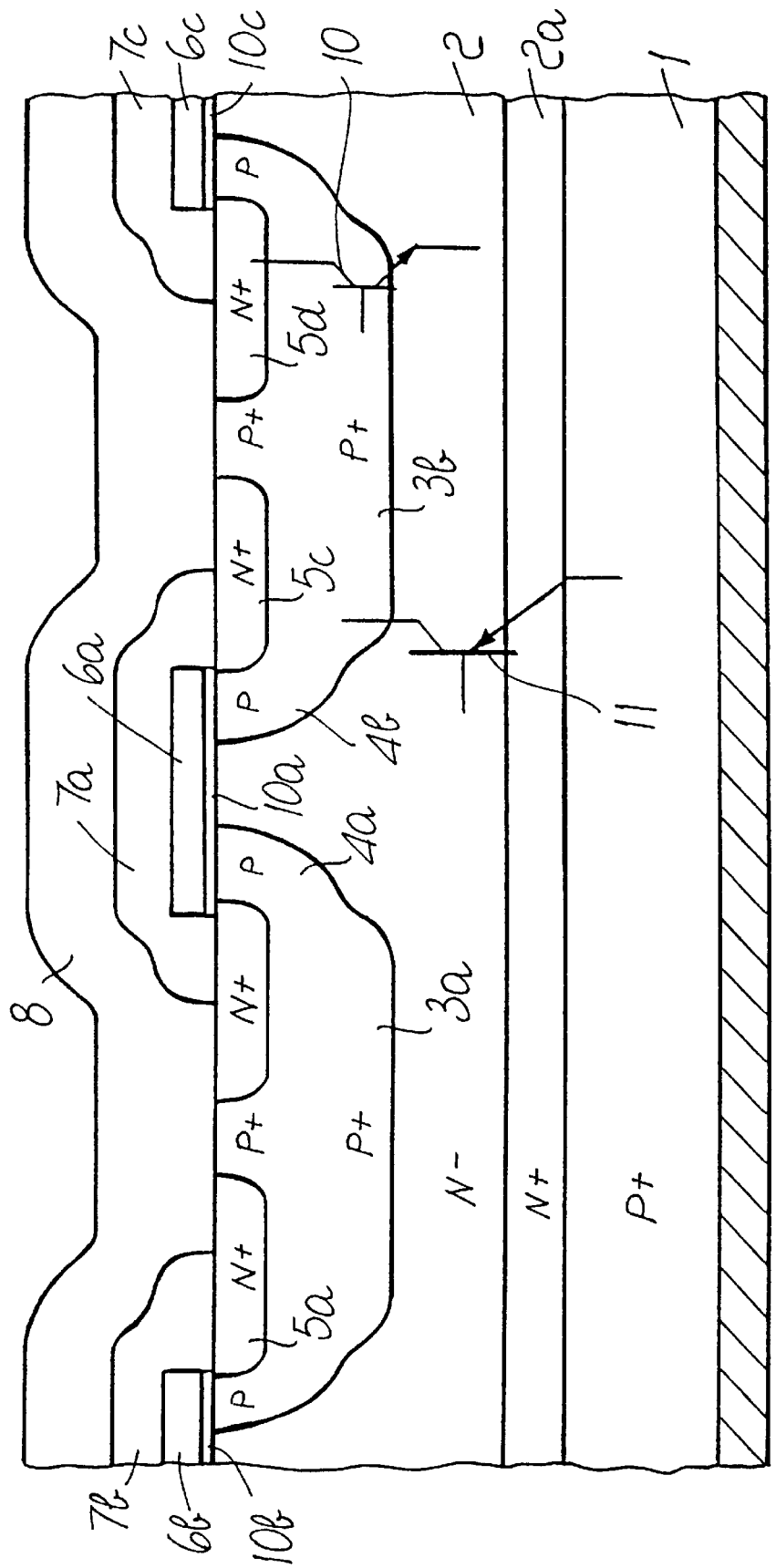
FIG. 2 is a cross-sectional view of an IGBT device with the corresponding parasitic transistors.
Figure 3:
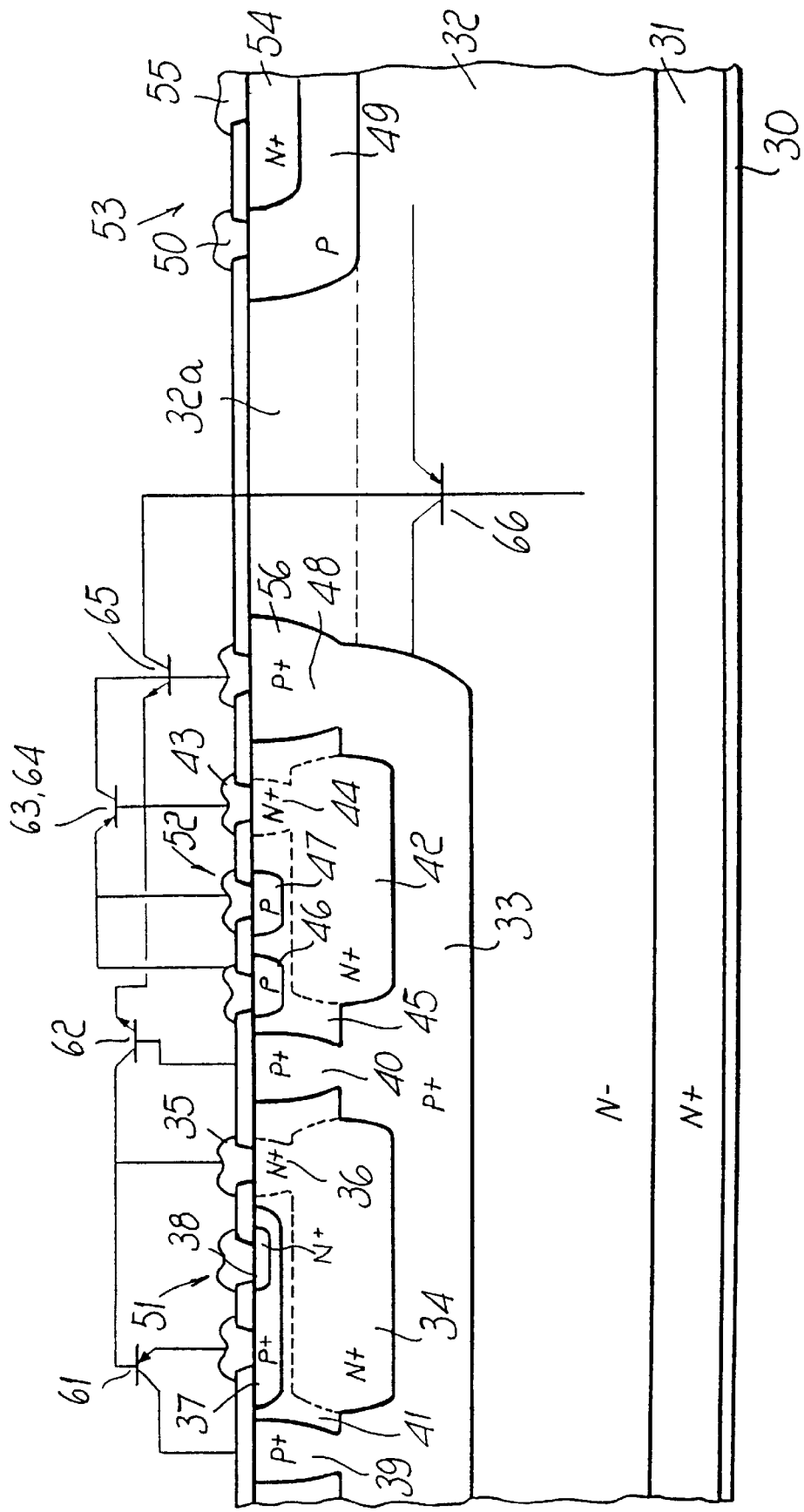
FIG. 3 is a cross-sectional view of a VIP device with the corresponding parasitic transistors.
Figure 4:
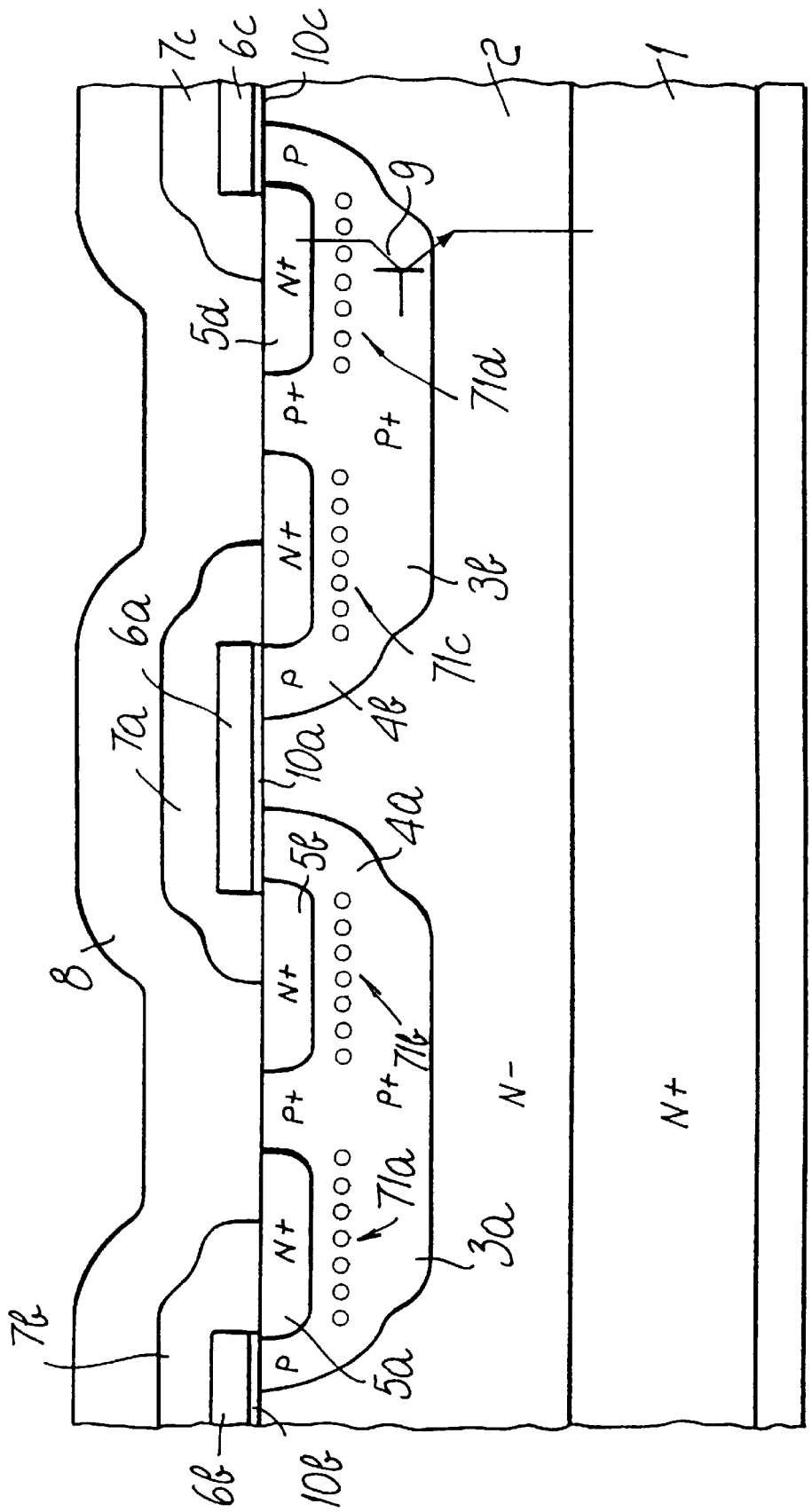
FIG. 4 is a cross-sectional view of a PMOS device according to the present invention.
Figure 5:
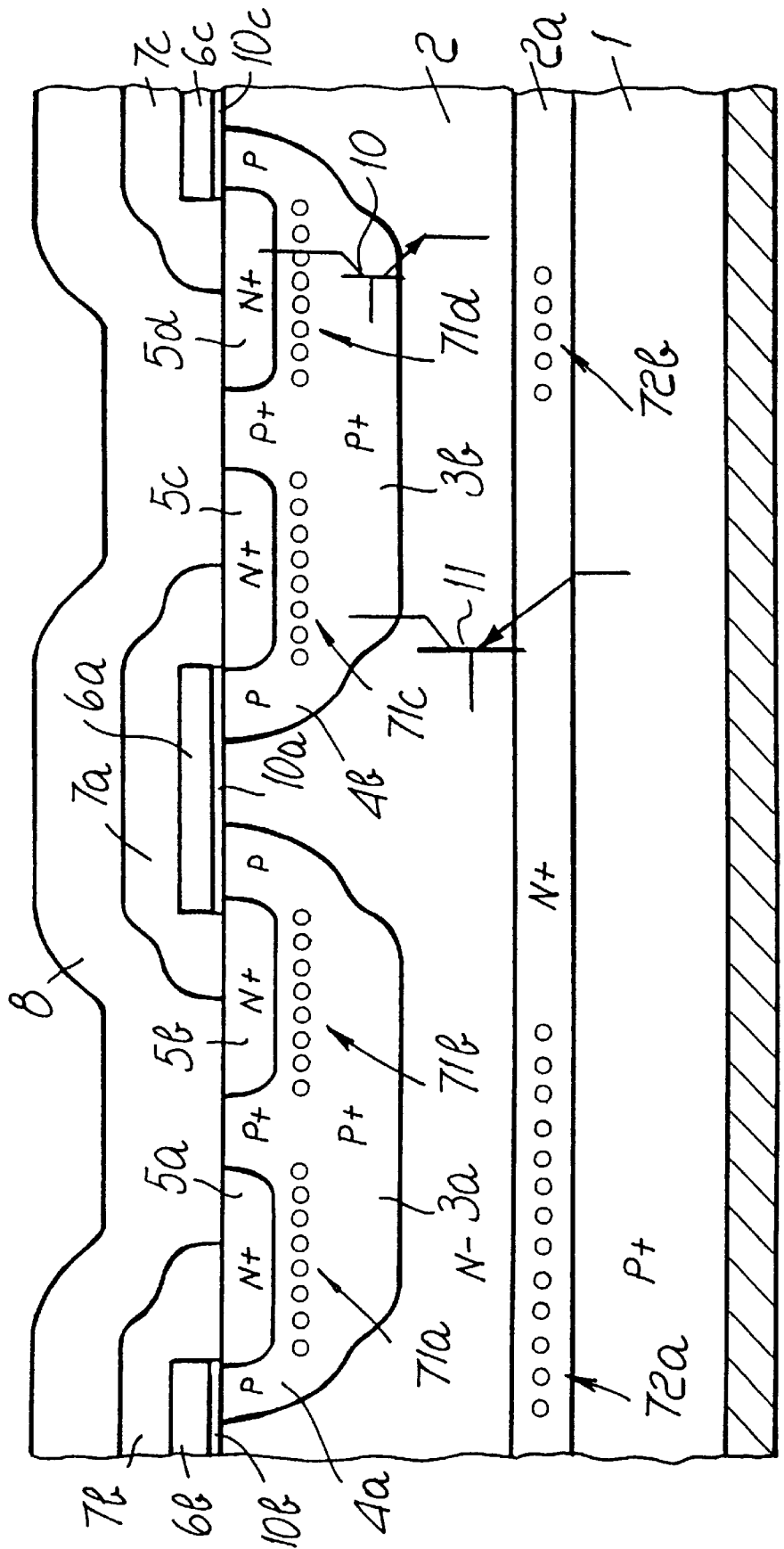
FIG. 5 is a cross-sectional view of an IGBT device according to the present invention.
Figure 6:
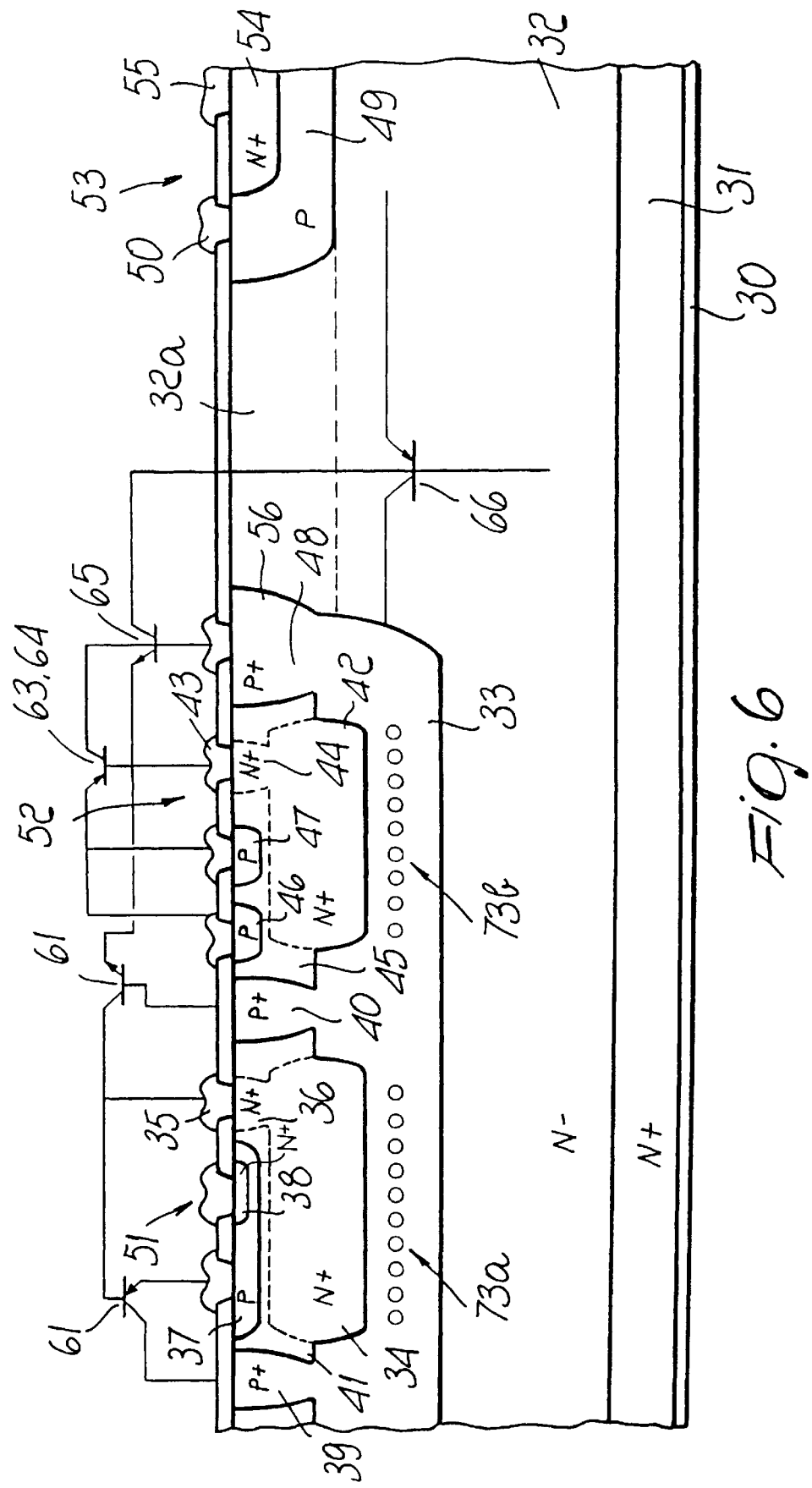
FIG. 6 is a cross-sectional view of a VIP device according to the present invention.

With reference to FIG. 4, in order to produce the PMOS device, an epitaxial layer 2 of the N⁻ type, with a resistivity of 20–100 Ωcm and a thickness of 20 to 100 microns, is grown on a silicon semiconducting substrate 1, that is heavily doped with donor impurities and has a resistivity of approximately 10–15 mΩcm.

A field oxide thicker than 1 micron is then grown on the epitaxial layer 2. Photolithography is subsequently performed to open windows through which acceptor atoms (boron) in high doses ($>10^{15}$ atoms/sq cm) are implanted. These atoms are subsequently diffused in the epitaxial layer 2 to form the deep-body regions 3a and 3b of the P⁺ type. The field oxide is then completely removed from the regions of the surface of the device where the elementary cells are produced. These regions are commonly termed active areas of the device. The oxide is not removed from the border regions.

Then a thin gate oxide is grown, and a layer of polysilicon is deposited thereon. The polysilicon layer and the gate oxide are selectively removed to open windows through which the ions of the active regions will be implanted. The removal of the oxide and of the polysilicon leaves a layer of gate oxide 10a above which there is the polysilicon gate 6a. Likewise, a layer of oxide 10b and 10c and a layer of silicon 6b and 6c are left respectively at the two borders of the device.

Acceptor impurities (boron) at a dose of approximately $10^{13}$ atoms/sq cm are implanted through the windows in the oxide. The boron is then diffused to form the P⁺-type body regions 4a and 4b. The body regions will constitute the channel of the elementary cell. The doping level of the body 4a and 4b thus determines the threshold voltage of the PMOS. As mentioned, the remaining polysilicon layer forms a grid that constitutes the gate electrode 6a of the PMOS. During implantion to form the P-body regions 4a and 4b, the boron ions are also introduced in the polysilicon, which thus acquires a slight P⁺-type doping.

Photolithography is then performed to produce the source regions 5a, 5b, 5c, and 5d.

Before implanting the impurities of the source regions, a high-dose (equal to or higher than $10^{16}$ atoms/sq cm) implantion of helium is performed at such an energy that the layer with the helium bubbles 71a, 71b, 71c, and 71d surrounds the source regions. In this manner, the helium bubbles form in the body/deep-body region where the base of the parasitic transistor 9 is located. It is subsequently possible to perform a thermal process at intermediate temperatures (approximately 700° C.) which makes the helium atoms coagulate into larger gaseous bubbles inside the silicon. By continuing the thermal process the helium evaporates and diffuses through the silicon. The final result is that empty cavities, with a size of approximately 50 A, are left in the implanted active region.

In this manner, the amount of silicon is reduced in the region that contains the helium cavities. The internal surfaces of the cavities are in fact recombination centers for the carriers, both electrons and holes, in the silicon.

If the lifetime reduction obtained by forming the cavities is not sufficient, it can be further reduced by implanting or depositing lifetime killer atoms (such as platinum or gold) and subsequently making them segregate by a thermal process to the region damaged by the presence of the cavities.

An implantation of donors (arsenic) at high doses ($10^5$ atoms/sq cm) is then performed through the same mask to obtain the source regions 5a–d.

A layer of dielectric, preferably a P-Vapox, is deposited on the entire surface. Windows are opened in the dielectric layer such that layers 7b and 7c of dielectric remain at the edges of the device and layer 7a remains above the gate 6a.

Finally, a layer of aluminum 8 is deposited on the surface and makes contact with the body regions 4a and 4b and with the source regions 5a–d of all the elementary cells.

The process for producing an IGBT device is similar to the PMOS process, with the difference that it is necessary to compensate for the negative effect of an additional parasitic transistor, the PNP transistor 11. Accordingly, after growing the first epitaxial layer 2a, a high-dose (above $10^{16}$ atoms/sq cm) implantation of helium is performed with an energy such that the helium remains confined within the first epitaxial layer 2a, which is of the N⁺ type.

The implanted helium, as mentioned earlier, allows for the formation of helium bubbles 72a and 72b in the active regions of the device.

The groups of cavities can be spread out uniformly. Alternatively, by means of a photomask, they may be arranged in alternate groups which are mutually spaced, typically at a distance of 1 micron.

Subsequently, it is possible to perform the thermal treatments described above for the PMOS device and the implantation of platinum or gold.

The second epitaxial layer 2 of the N⁻ type with higher resistivity (20–100 Ωcm) than the layer 2a is then grown above the first epitaxial layer 2a to a thickness of 20 to 100 microns.

The subsequent steps are identical to those described above for the PMOS device including the implantation of helium to reduce the effect of the NPN⁻ type parasitic transistor 10.

The VIP device according to the present invention is produced in the following manner. The method for reducing only the effect of the parasitic transistor 65 is described, since this is the most harmful one, but the described technique can be generalized for the other parasitic transistors as well.

An epitaxial layer 32 of the N⁻ type, with a resistivity of 20–100 Ωcm and a thickness of 20 to 100 microns, is grown above a silicon semiconducting substrate 31 of the N+ type, heavily doped with donor impurities with a resistivity of approximately 10–15 mΩcm. A field oxide thicker than 1 micron is then grown thermally on the surface of the epitaxial layer 32. Photolithography is then performed to open an area through which acceptor atoms (boron) are implanted at a low dosage, approximately $10^{13}$ atoms/sq cm. These atoms are diffused in the epitaxial layer 32 to form the P+-type region 33, known as buried layer or P-well, A second photolithographic is then performed to open a window inside the area formed by the first photolithographic step. Donor atoms (antimony) at high doses (approximately $10^{15}$ atoms/sq cm) are implanted in this window for the subsequent creation of the N+ buried-layer regions 34 and 42.

Before creating these regions, helium is implanted at high doses (higher than $10^{16}$ atoms/sq cm) through the second window with an energy such that the helium layer, constituted of helium bubbles, will surround the N+ buried layers 34 and 42. The helium is then thermally treated to make the helium atoms coagulate and to create larger helium bubbles, designated by the reference numerals 73a and 73b, as in the previously described examples. As clearly shown, helium implantion occurs in the base region of the parasitic transistor 65. For the other parasitic transistors it is not necessary to implant helium atoms in the regions where their bases are present.

If the effect of the helium bubbles is not sufficient, it is possible to perform a platinum implantation, subsequently diffusing it to make the platinum atoms segregate into the region of the cavities/bubbles.

After creating the helium bubbles/cavities, the atoms implanted to create the N+ buried-layer regions 34 and 42 are diffused in order to form these regions. Then, the field oxide is removed completely and a second epitaxial layer 32a is grown; a second field oxide, thicker than one micron, is thermally grown onto said layer 32a.

Next, the insulation photolithographic technique is performed, forming a frame that corresponds to the edge 56 of the buried-layer region 33. The same photolithographic technique also forms a window in the region that will constitute the base 49 of the power transistor 53. Acceptor atoms (boron) are then implanted through these windows at a dosage of approximately $10^{14}$ atoms/sq cm. These atoms are subsequently diffused. The times and temperatures of diffusion are such that the boron atoms reach the depth of the P+-type buried layer 33, i.e. the insulation 48 and he buried layer 33 form a single electrically connected well-shaped region. This well electrically insulates the N-type region 45 inside it from the N-type region 32a outside it. At the same time, the base 49 of the power transistor 53 is diffused.

The photolithographic step for the sinker and the emitter is subsequently performed. This photolithographic step opens windows that define the sinkers 36 and 44 of the linear circuit and the emitter 54 of the power transistor 53. The sinkers 36 and 44 are N+-type regions that connect the N+-type buried layers 34 and 42 to the surface of the wafer and electrically connect the buried layers 34 and 42 to the surface. The sinker 44 of the transistor 52 constitutes the base of this transistor.

After the photolithographic step, phosphorus at a high concentration is deposited inside an oven, and then the sinkers 36 and 44 and the emitter 54 of the power transistor 53 are diffused simultaneously.

Another photolithographic step is then performed to define the base 37 of the transistor 51 and the emitter 46 and the collector 47 of the transistor 52. Acceptor ions are then implanted and subsequently diffused to create the base 37, the emitter 46, and the collector 47. Another photolithographic step is performed to define the emitter 38 of the transistor 51. After this, phosphorus is deposited at a high concentration in an oven. The phosphorus is diffused to create the emitter 38.

Finally, by means of an additional photolithographic step, aluminum is deposited to form the contacts for the various terminals, and the metallization layer on the back of the device which forms the collector 30 of the power transistor 53 is also formed.

Preferably, cavity formation and helium evaporation occur before the device is metalized.

Furthermore, as shown by the previous examples, the defects produced by the helium cavities are preferably introduced in the regions where the bases of the various parasitic transistors are present. However, it is also possible to act on the other terminals of the parasitic transistors, and in the case of other parasitic elements, such as diodes, it is also possible to act on the anodes and on the cathodes.

As has been clearly shown, the present invention introduces the cavities formed by the helium in an active region of the device, so that the amount of silicon is reduced in that region. This charge carrier lifetime control technique is advantageous in that it localizes very precisely the low-lifetime region both horizontally and vertically.

Other lifetime killers which are known in the art (gold and platinum) are in fact first implanted and deposited and then diffused. In this case, diffusion is necessary since both ion implantion and deposition introduce these atoms very superficially.

Helium, instead, by virtue of its very low mass, can be implanted even at a depth of a few microns with implantation energies that are relatively high but in any case available with modern implantion equipment. In this way it is possible to neutralize the transistor 11 of the IGBT device. This leads to the advantage that the gaseous bubbles form during helium implantion at a desired depth. Use of helium furthermore allows the formation of relatively large defects and avoids the formation of spot-like defects which could be created by the known techniques.

Another advantage of the present invention is that once the cavities have been formed, they remain sufficiently stable even after subsequent high-temperature thermal processes. The subsequent thermal treatments are meant to make the smaller bubbles coagulate into larger bubbles and to reduce the width of the band containing the bubbles (typically down to a thickness value of 0.2 micron) containing the gaseous bubbles so as to provide a limited resistivity value. In this manner, the positive result, reduction of the effects of the parasitic elements, is not cancelled by the negative effect of the increase in resistivity.

Having thus described at least one illustrative embodiment of the invention, various alterations, modifications and improvements will readily occur to those skilled in the art. Such alterations, modifications, and improvements are intended to be within the spirit and scope of the invention. For example, the materials employed, as well as their shapes and dimensions may be modified according to the requirements of the device. Accordingly, the foregoing description is by way of example only and is not intended as limiting. The invention is limited only as defined in the following claims and the equivalents thereto.

What is claimed is:

1. An integrated electronic device for locally reducing a lifetime of charge carriers, comprising:

at least one active region formed in a semiconductor substrate at a junction of a first semiconductor material and a second semiconductor material, at least a portion of the at least one active region being positioned at a surface of the semiconductor substrate, wherein ions of a noble gas are implanted in the at least one active region, the ions of the noble gas forming a plurality of gaseous bubbles inside the at least one active region.

2. The integrated electronic device according to claim 1, having a plurality of cavities in the at least one active region, each of the plurality of cavities corresponding to one of the plurality of gaseous bubbles.

3. The integrated electronic device according to claim 2, further comprising foreign atoms disposed adjacent each of the plurality of cavities.

4. The integrated electronic device according to claim 3, wherein the foreign atoms are selected from a group consisting of gold atoms, platinum atoms and mixtures thereof.

5. The integrated electronic device according to claim 3, wherein the at least one active region is a terminal of at least one parasitic element in the integrated electronic device.

6. The integrated electronic device according to claim 2, wherein the at least one active region is a terminal of at least one parasitic element in the integrated electronic device.

7. The integrated electronic device according to claim 2, wherein the at least one active region is a terminal of at least one parasitic transistor in the integrated electronic device.

8. The integrated electronic device according to claim 2, wherein the at least one active region is a base of at least one parasitic transistor in the integrated electronic device.

9. The integrated electronic device according to claim 2, wherein the at least one active region is an emitter of at least one parasitic transistor in the integrated electronic device.

10. The integrated electronic device according to claim 2, wherein the at least one active region is a collector of at least one parasitic transistor in the integrated electronic device.

11. The integrated electronic device according to claim 2, wherein the at least one parasitic element is a parasitic diode in the integrated electronic device.

12. The integrated electronic device according to claim 2, wherein the at least one active region is an anode of a parasitic diode in the integrated electronic device.

13. The integrated electronic device according to claim 2, wherein the at east one active region is a cathode of a parasitic transistor in the integrated electronic device.

14. The integrated electronic device according to claim 2, wherein the noble gas is helium.

15. The integrated electronic device according to claim 1, wherein the at least one active region is a terminal of at least one parasitic element in the integrated electronic device.

16. The integrated electronic device according to claim 15, wherein the noble gas is helium.

17. An integrated electronic device, comprising:
at least one active region formed in a semiconductor substrate at a junction of a first semiconductor material and a second semiconductor material, at least a portion of the first semiconductor material being positioned at a surface of the semiconductor substrate and having a plurality of cavities disposed adjacent the second semiconductor material to reduce a lifetime of charge carriers in the at least one active region.

18. The integrated electronic device according to claim 17, further comprising foreign atoms disposed adjacent each of the plurality of cavities.

19. The integrated electronic device according to claim 18, wherein the foreign atoms are selected from a group consisting of platinum atoms, gold atoms and mixtures thereof.

20. The integrated electronic device according to claim 17, wherein the at least one active region includes a terminal of at least one parasitic element in the integrated electronic device.

21. The integrated electronic device according to claim 20, wherein the at least one parasitic element is a parasitic transistor.

22. The integrated electronic device according to claim 20, wherein the at least one parasitic element is a parasitic diode.

23. An integrated electronic device, comprising:
at least one active region formed in a semiconductor substrate at a junction of a first semiconductor material and a second semiconductor material, at least a portion of the first semiconductor material being positioned adjacent a surface of the semiconductor substrate, wherein the first semiconductor material has a band of cavities disposed adjacent the second semiconductor material for locally reducing a lifetime of charge carriers in the active region.

24. The integrated electronic device according to claim 23, wherein the at least one active region comprises a terminal of at least one parasitic element of the integrated electronic device.

25. The integrated electronic device according to claim 24, wherein the at least one parasitic element includes a parasitic transistor.

26. The integrated electronic device according to claim 24, wherein the at least one parasitic element includes a parasitic diode.

27. The integrated electronic device according to claim 23, further comprising foreign atoms disposed adjacent the band of cavities.

28. The integrated electronic device according to claim 27, wherein the foreign atoms are selected from a group consisting of gold atoms, platinum atoms and mixtures thereof.

* * * * *